United States Patent
Kajbafvala et al.

(10) Patent No.: US 12,163,227 B2
(45) Date of Patent: Dec. 10, 2024

(54) FILM DEPOSITION SYSTEMS AND METHODS

(71) Applicant: ASM IP Holding B.V., Almere (NL)

(72) Inventors: Amir Kajbafvala, Chandler, AZ (US); Yanfu Lu, Phoenix, AZ (US); Caleb Miskin, Mesa, AZ (US)

(73) Assignee: ASM IP Holding B.V., Almere (NL)

( * ) Notice: Subject to any disclaimer, the term of this patent is extended or adjusted under 35 U.S.C. 154(b) by 250 days.

(21) Appl. No.: 17/684,523

(22) Filed: Mar. 2, 2022

(65) Prior Publication Data

US 2022/0282370 A1    Sep. 8, 2022

Related U.S. Application Data

(60) Provisional application No. 63/157,294, filed on Mar. 5, 2021.

(51) Int. Cl.
   *C23C 16/458*    (2006.01)
   *C23C 16/22*    (2006.01)
   *C23C 16/52*    (2006.01)

(52) U.S. Cl.
   CPC .......... *C23C 16/458* (2013.01); *C23C 16/22* (2013.01); *C23C 16/52* (2013.01)

(58) Field of Classification Search
   CPC ........... H01L 21/02532; H01L 21/0245; C23C 16/45523; C23C 16/52; C23C 16/22
   See application file for complete search history.

(56) References Cited

U.S. PATENT DOCUMENTS

| | | | |
|---|---|---|---|
| 7,476,627 B2 | 1/2009 | Pomarede | |
| 7,928,019 B2 | 4/2011 | Surthi | |
| 8,771,539 B2 | 7/2014 | Zhang | |
| 9,881,790 B2 | 1/2018 | Dube | |
| 10,128,110 B2 | 11/2018 | Dube | |
| 10,446,393 B2 | 10/2019 | Bhargava | |
| 10,612,136 B2 | 4/2020 | Sreeram | |
| 2002/0169968 A1* | 11/2002 | Gammel | G06F 21/85 713/189 |
| 2003/0045063 A1* | 3/2003 | Oda | H01L 21/0245 257/E21.403 |
| 2004/0217430 A1* | 11/2004 | Chu | H01L 29/66628 257/E29.253 |

(Continued)

OTHER PUBLICATIONS

Machkaoutsan et al.; High Efficiency Low Temperature Pre-epi Clean Method for Advanced Group IV Epi Processing; ECS Transactions, 50 (9) 339-348 (2012).

*Primary Examiner* — Joseph A Miller, Jr.
(74) *Attorney, Agent, or Firm* — Snell & Wilmer L.L.P.

(57) ABSTRACT

A method of forming a structure is provided. The method includes supporting a substrate within a reaction chamber of a semiconductor processing system, flowing a silicon precursor and a germanium precursor into the reaction chamber, and forming a silicon-germanium layer overlaying the substrate with the silicon containing precursor and the germanium precursor. Concentration of the germanium precursor within the reaction chamber is increased during the forming of the silicon-germanium layer overlaying the substrate. Methods of forming film stack structures, semiconductor device structures, and semiconductor processing systems are also described.

16 Claims, 4 Drawing Sheets

(56) References Cited

U.S. PATENT DOCUMENTS

| | | | |
|---|---|---|---|
| 2004/0259333 A1* | 12/2004 | Tomasini | C30B 29/52 |
| | | | 257/E21.131 |
| 2005/0079691 A1* | 4/2005 | Kim | H01L 21/02579 |
| | | | 438/481 |
| 2005/0164474 A1* | 7/2005 | Guha | C23C 16/24 |
| | | | 438/479 |
| 2005/0191826 A1 | 9/2005 | Bauer | |
| 2007/0264801 A1* | 11/2007 | Cody | C30B 29/52 |
| | | | 438/493 |
| 2008/0206981 A1 | 8/2008 | Tamura | |
| 2017/0053792 A1 | 2/2017 | Lu | |
| 2019/0288084 A1 | 9/2019 | Wang | |
| 2020/0040458 A1 | 2/2020 | Ma | |
| 2020/0144058 A1* | 5/2020 | Kohen | H01L 21/02532 |

* cited by examiner

FILM DEPOSITION SYSTEMS AND METHODS

CROSS-REFERENCE TO RELATED APPLICATIONS

This application is a non-provisional of, and claims priority to and the benefit of, U.S. Provisional Patent Application No. 63/157,294, filed on Mar. 5, 2021 and entitled "FILM DEPOSITION SYSTEMS AND METHODS," which is hereby incorporated by reference herein.

FIELD OF INVENTION

The present disclosure generally relates to forming structures. More particularly, the present disclosure relates to controlling composition of layer structures formed overlaying substrates, such as germanium composition within silicon-germanium layer structures formed overlaying substrates.

BACKGROUND OF THE DISCLOSURE

Films, such as silicon-germanium films, are commonly deposited onto substrates during the fabrication of transistor semiconductor devices on semiconductor substrates. The films may be employed to define various structures of the transistor devices including sources, drains, channels, and/or gate structures of various transistor devices formed on the substrate. The source and the drain are generally spaced apart from one another, the channel typically connects the drain to the source, and the gate is generally formed in association with the channel to control the flow of electric current between the source and the drain through the channel. Typically, the transistors devices on the substrate are with two-dimensional (e.g., planar) or three-dimensional (e.g., fin or gate-all-around) architectures. Such architectures allow large numbers of transistor devices to be progressively formed on substrates in large integrations using various fabrication operations, such as film deposition, patterning, and etch operations.

In some transistor devices, variation of the composition of certain films may influence physical and/or electrical properties of the transistor device. Variation of constituent concentration within the thickness of some films (e.g., in a direction upward from the surface of the substrate) may interact with a succeeding etch operation, the etchant employed tending to remove portions of the film thickness having greater constituent concentration more rapidly (or more slowly) than portions of the film thickness having smaller concentrations of the constituent. As a consequence, the etchant may remove greater amounts of material from one side of the layer than the other side of the layer according to the gradient of the constituent concentration with the layer, potentially causing structures adjacent the layer and intended to have a common shape to be formed with different shapes. For example, nanowires forming channels in gate-all-around transistor devices may be formed with differing minimum cross-sectional areas due to variation of germanium concentration in an intervening silicon-germanium layer, potentially altering the electrical properties of the channel and/or the reliability of the transistor device incorporating the channel structure formed by the nanowires. For that reason, film deposition operations are generally controlled such that variation in constituent concentration profile within the thickness of the film is within predetermined limits, typically by employing various process control techniques and concentration variation countermeasures known to be effective in limiting variation in constituent concentration within the thickness of a deposited film.

Such systems and methods for depositing silicon-germanium films have generally been considered suitable for their intended purpose. However, there remains a need in the art for improved methods of forming structures, methods of forming film stacks, semiconductor device structures, and semiconductor processing systems. The present disclosure provides a solution to this need.

SUMMARY OF THE DISCLOSURE

A method of forming a structure is provided. The method includes supporting a substrate within a reaction chamber of a semiconductor processing system, flowing a silicon precursor and a germanium precursor into the reaction chamber, and forming a silicon-germanium layer overlaying the substrate with the silicon containing precursor and the germanium precursor. Concentration of the germanium precursor within the reaction chamber is increased during the forming of the silicon-germanium layer overlaying the substrate.

In certain examples, the substrate may include a blanket substrate. An electrically insulative layer may overlay a surface of the substrate. The electrically insulative layer may include silicon oxide and/or silicon nitride.

In certain examples, the substrate may include a patterned substrate.

In certain examples, the substrate may include a blanket substrate.

In certain examples, increasing concentration of the germanium precursor may include continuously increasing concentration of the germanium precursor within the reaction chamber during the forming of the silicon-germanium layer.

In certain examples, increasing concentration of the germanium precursor may include increasing concentration of the germanium precursor within the reaction chamber according to a linear function during forming of the silicon-germanium layer.

In certain examples, increasing concentration of the germanium precursor may include increasing concentration of the germanium precursor within the reaction chamber according to a nonlinear function during forming of the silicon-germanium layer.

In certain examples, increasing concentration of the germanium precursor may include increasing concentration of the germanium precursor within the reaction chamber according to an exponential function during forming of the silicon-germanium layer.

In certain examples, increasing concentration of the germanium precursor may include increasing concentration of the germanium precursor within the reaction chamber according to a logarithmic function during the forming of the silicon-germanium layer.

In certain examples, the silicon precursor may include a hydrogenated silicon precursor and a chlorinated silicon precursor.

In certain examples, the hydrogenated precursor may be selected from a group including: silane ($SiH_4$), disilane ($Si_2H_6$), trisilane ($Si_3H_8$), and tetrasilane ($Si_4H_{10}$).

In certain examples, the chlorinated silicon precursor may be selected from a group including: monochlorosilane (MCS), dichlorosilane (DCS), trichlorosilane (TCS), hexachlorodisilane (HCDS), octachlorotrislane (OCS), and silicon tetrachloride (STC).

In certain examples, flowing the silicon precursor and the germanium precursor into the reaction chamber may include flowing a halide into the reaction chamber, wherein the halide is selected from a group comprising: chlorine ($Cl_2$) and hydrochloric acid (HCl).

In certain examples, a purge/carrier gas may be flowed into the reaction during the forming of the silicon-germanium layer. The purge/carrier gas may be selected from a group comprising: helium (He), hydrogen ($H_2$), argon (Ar), krypton (Kr), and nitrogen ($N_2$).

In certain examples, forming the silicon-germanium layer may include heating the substrate to a temperature of between about 400 degrees Celsius (° C.) and about 800° C.

In certain examples, forming the silicon-germanium layer may include maintaining a pressure within the reaction chamber of between about 760 torr and about 5 torr within the reaction chamber during the forming of the silicon-germanium layer.

In certain examples, increasing concentration of the germanium precursor within the reaction chamber during the forming of the silicon-germanium layer may include increasing concentration of the germanium precursor to between about 100.5% and about 180% of an initial concentration of the germanium precursor within the reaction chamber.

In certain examples, a second silicon precursor may be flowed into the reaction chamber subsequent to forming the silicon-germanium layer.

In certain examples, the second silicon precursor may be the same as the first silicon precursor.

In certain examples, the second silicon precursor may be different than the first silicon precursor.

A method of forming a film stack structure is provided. The method includes supporting a substrate within a reaction chamber of a semiconductor processing system, wherein the substrate is a blanket substrate; flowing a first silicon precursor, a germanium precursor, and a halide into the reaction chamber, wherein the halide is selected from a group comprising chlorine ($Cl_2$) and hydrochloric acid (HCl); and forming a silicon-germanium layer overlaying the substrate with the first silicon precursor and the germanium precursor, wherein the first silicon precursor comprises a hydrogenated first silicon precursor and a chlorinated first silicon precursor. A second silicon precursor into the reaction chamber and a silicon layer is formed onto the silicon-germanium layer with the second silicon precursor, wherein the second silicon precursor is selected from a group comprising: silane ($SiH_4$), disilane ($Si_2H_6$), trisilane ($Si_3H_8$), tetrasilane ($Si_4H_{10}$), and dichlorosilane (DCS). Flowing the germanium precursor into the reaction chamber includes increasing concentration of the germanium precursor within the reaction chamber during the forming of the silicon-germanium layer overlaying the substrate, and concentration of the germanium precursor is increased continuously according to a linear function during the step of forming the silicon-germanium layer.

A semiconductor processing system is provided. The semiconductor processing system includes a reaction chamber, a silicon precursor source connected to the reaction chamber, a germanium precursor source connected to the reaction chamber, and a controller operably connected the silicon precursor source and the germanium precursor source. The controller is responsive to instructions recorded on a memory to support a substrate within the reaction chamber, flow a silicon precursor and a germanium precursor into the reaction chamber, form a silicon-germanium layer overlaying the substrate with the silicon containing precursor and the germanium precursor, and increase concentration of the germanium precursor within the reaction chamber during forming of the silicon-germanium layer overlaying the substrate.

This summary is provided to introduce a selection of concepts in a simplified form. These concepts are described in further detail in the detailed description of examples of the disclosure below. This summary is not intended to identify key features or essential features of the claimed subject matter, nor is it intended to be used to limit the scope of the claimed subject matter.

BRIEF DESCRIPTION OF THE DRAWING FIGURES

While the specification concludes with claims particularly pointing and distinctly claiming what are regarded as embodiments of the present disclosure, the advantages of embodiments of the present disclosure may be more readily ascertained from the description of certain examples of the embodiments of the present disclosure when read in conjunction with the accompanying drawings, in which:

Figure 3A:
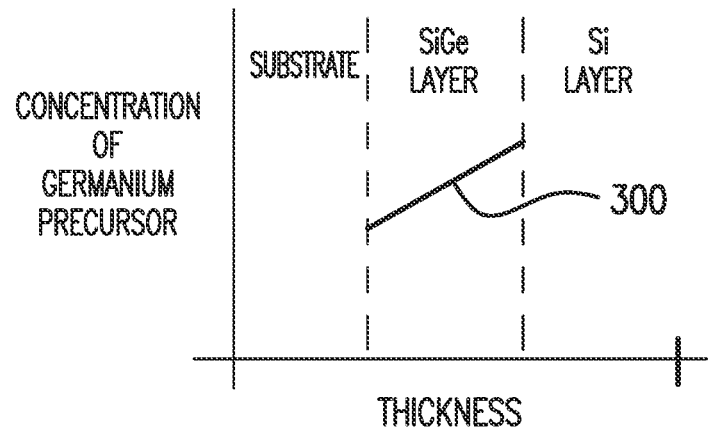
Figure 3B:
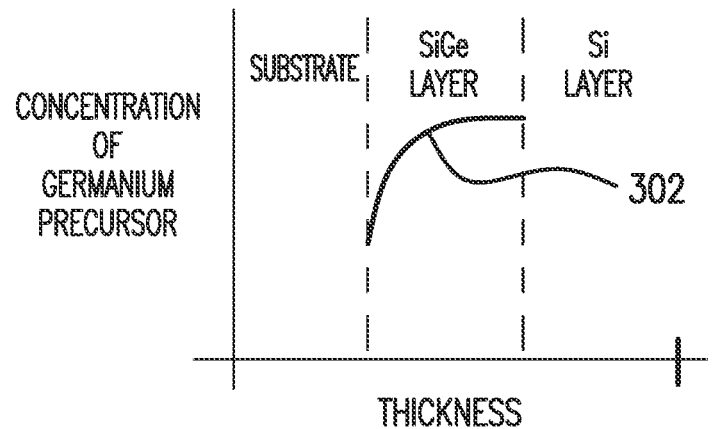
Figure 3C:
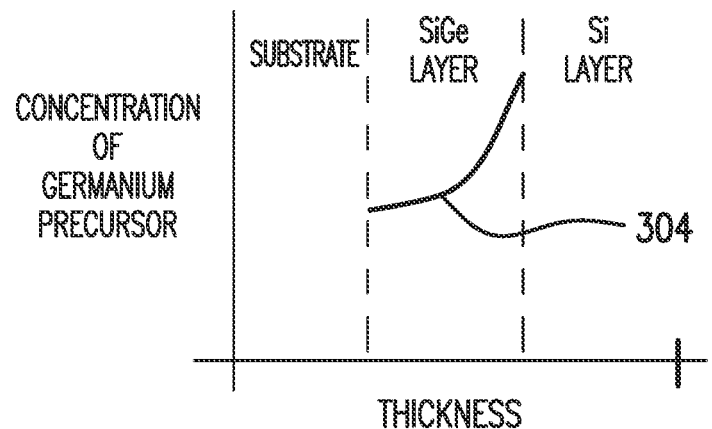
Figure 4A:
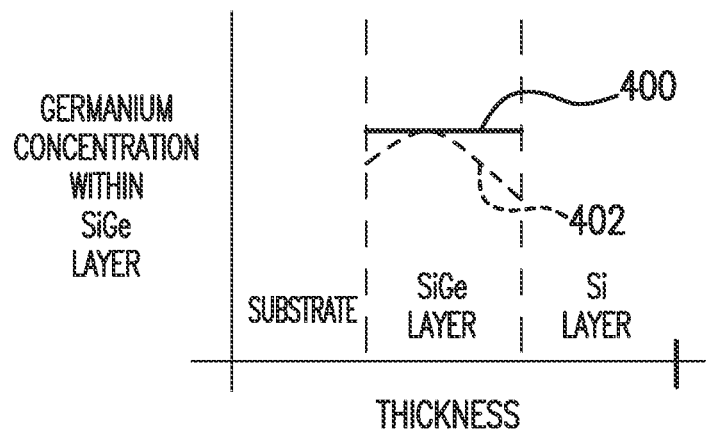
Figure 4B:
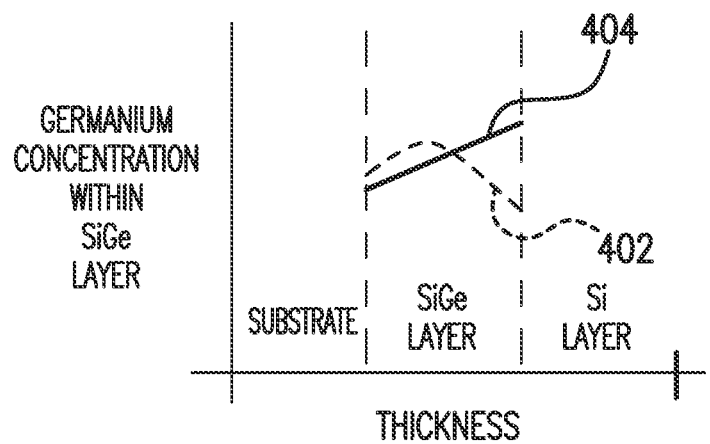
Figure 4C:
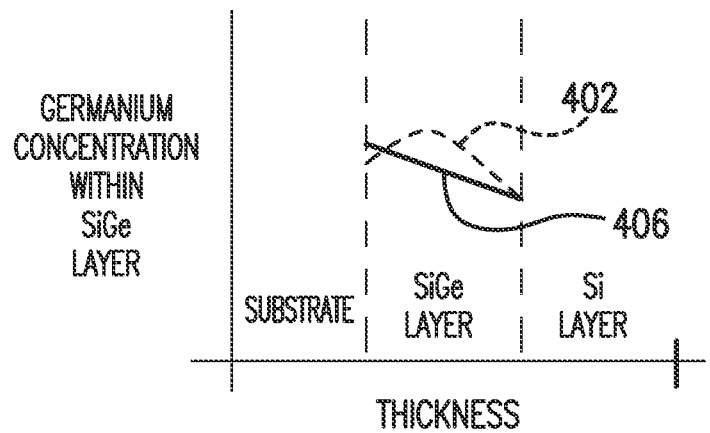

FIGS. 3A-3C are graphs of concentration of germanium precursor during the forming silicon-germanium layer structures, showing the concentration of a germanium precursor within a reaction chamber being increased according to a linear function and non-linear functions during the forming of the silicon-germanium layer structure; and FIGS. 4A-4C are graphs of germanium concentration profiles within silicon-germanium layers formed while increasing concentration of a germanium precursor within the reaction chamber, showing germanium concentration variation within the resulting silicon-germanium layers relative to a layer formed with constant germanium precursor concentration.

It will be appreciated that elements in the figures are illustrated for simplicity and clarity and have not necessarily been drawn to scale. For example, the relative size of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood and appreciated by those of skill in the art that the present disclosure extends beyond the specifically disclosed examples and/or uses of the examples and/or modifications of the examples and equivalents thereof. Thus, it is intended that the scope of the present disclosure should not be limited by the particular examples described below.

As used herein, the term "substrate" may refer to any underlying material or materials that may be used, or upon which, a device, a circuit, or a film may be formed.

As used herein, the term "epitaxial layer" may refer to a substantially single crystalline layer upon an underlying substantially single crystalline layer or substrate.

As used herein, the term "chemical vapor deposition" may refer to any process wherein a substrate is exposed to one or more volatile precursors, which react and/or decompose on a substrate surface to form thereon a desired layer material.

As used herein, the term "silicon-germanium" may refer to a semiconductor material comprising silicon and germanium and may be represented as $Si_{1-x}Ge_x$.

The present disclosure relates, generally, to methods of forming structures overlaying substrates. More particularly, the present disclosure relates to controlling concentration of layer constituents within the thickness of layers, such as germanium within silicon-germanium layers. The examples of the present disclosure may provide methods of forming structures overlaying substrates including silicon-germanium layers wherein germanium concentration within the thickness of the silicon-germanium layer is uniform, such as within an intermediate portion of the film thickness. The examples of the present disclosure may also provide methods of forming structures overlaying substrates including silicon-germanium layers wherein germanium concentration within the thickness of the silicon-germanium layer corresponds to a predetermined profile, for example, such that germanium concentration within a lower transition portion of the thickness profile corresponds to germanium concentration within an upper transition portion of the thickness profile.

Figure 1:
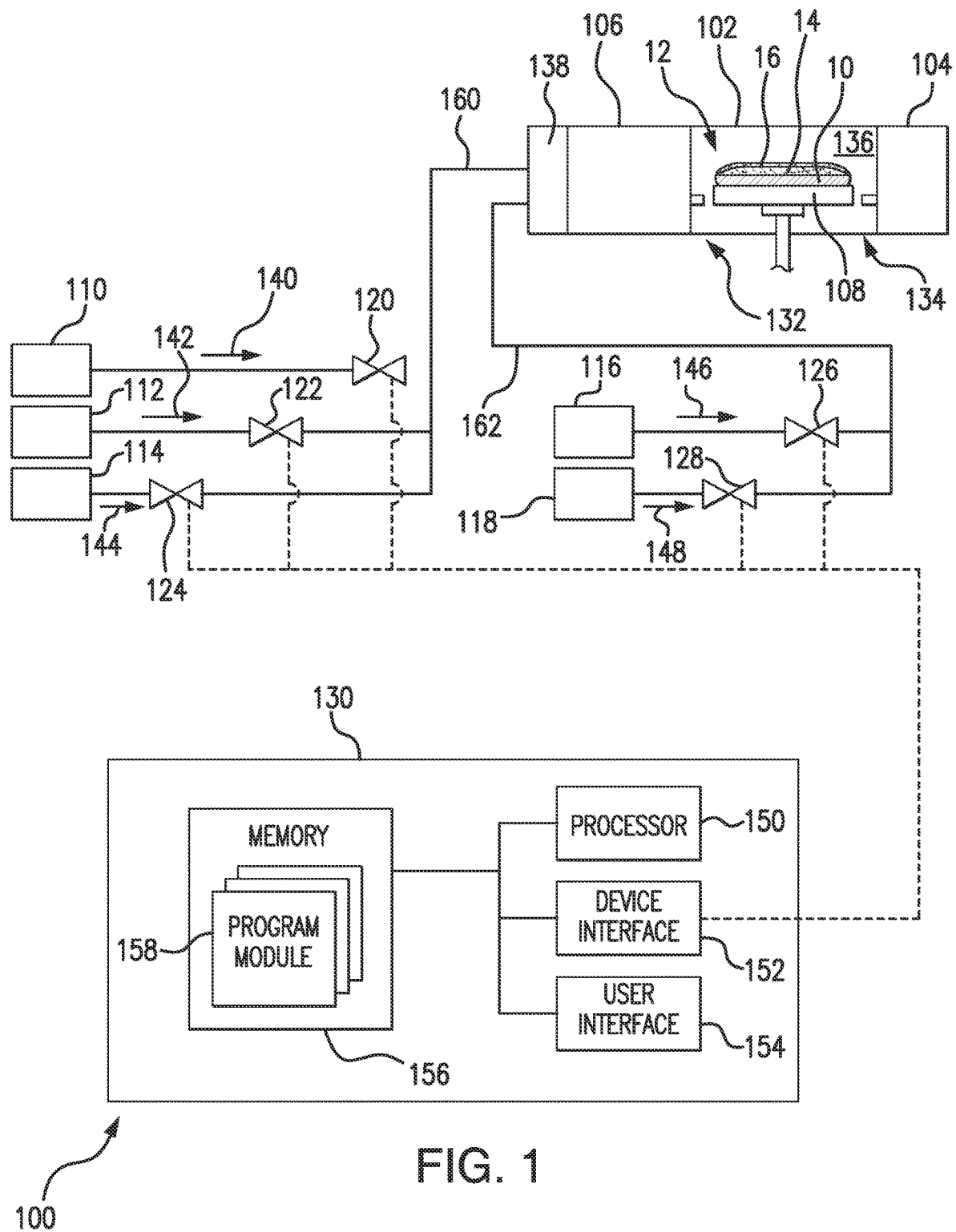
FIG. 1 is a schematic view of a semiconductor processing system constructed in accordance with the present disclosure, showing a reaction chamber operatively associated with a controller for forming a layer structure overlaying a substrate.

Referring to FIG. 1, a semiconductor processing system 100 is shown. The semiconductor processing system 100 includes a reaction chamber 102, an exhaust flange 104, an injection flange 106, and a substrate holder 108. The semiconductor processing system 100 also includes a first silicon precursor source 110, a second silicon precursor source 112, a germanium precursor source 114, a halide source 116, and a purge/carrier gas source 118. As shown in FIG. 1, the semiconductor processing system 100 further includes a first silicon precursor valve 120, a second silicon precursor valve 122, a germanium precursor valve 124, a halide valve 126, purge/carrier gas valve 128, and a controller 130. Although a particular type of semiconductor processing system 100 is shown in FIG. 1 and described herein, e.g., an atmospheric chemical vapor deposition (CVD) system, it is to be understood and appreciated that other types of semiconductor processing systems may also benefit from the present disclosure, such as atomic layer deposition systems and plasma enhanced CVD systems and are within the scope of the present disclosure.

The reaction chamber 102 has an injection end 132 and an opposite exhaust end 134. The exhaust flange 104 is connected to the exhaust end 134 of the reaction chamber 102 and is configured to fluidly couple an interior 136 of the reaction chamber 102 to an exhaust source, such as a scrubber. The substrate holder 108 is supported within the interior 136 of the reaction chamber between the exhaust end 134 and the injection end 132 of the reaction chamber 102 and is configured to support thereon a substrate 10 during forming of one or more layer, e.g., a film stack 12 comprising a silicon-germanium layer 14 and a silicon layer 16, overlaying the substrate 10. The injection flange 106 is connected to the injection end 132 of the reaction chamber 102, is fluidly coupled to the exhaust flange 104 by the interior of 136 of the reaction chamber 102, and fluidly couples one or more of the precursor sources, e.g., the first silicon precursor source 110, the second silicon precursor source 112, the germanium precursor source 114, the halide source 116, and/or the purge/carrier gas source 118, to the interior 136 of the reaction chamber 102. It is contemplated that the injection flange 106 may cooperate with a mixer 138 for intermixing precursors, a halide, and/or purge/carrier gases flowed into the reaction chamber 102. The reaction chamber 102 may be as shown and described in U.S. Pat. No. 7,476,627 to Pomarede et al., issued on Jan. 13, 2009, the contents of which are incorporated herein by reference in its entirety.

The first silicon precursor source 110 includes a first silicon precursor 140 and is connected to the reaction chamber 102, e.g., via a precursor conduit 160. More specifically, the first silicon precursor source 110 is connected to the reaction chamber 102 by the injection flange 106. Specifically, the first silicon precursor source 110 is connected to the reaction chamber 102 by the first silicon precursor valve 120, which may include a mass flow controller (MFC) operably associated with the controller 130, and injection flange 106, the first silicon precursor source 110 thereby configured to flow the first silicon precursor 140 into the reaction chamber 102. In certain examples, the first silicon precursor source 110 may be connected to the reaction chamber 102 through the mixer 138 to flow the first silicon precursor 140 into the reaction chamber 102 with another precursor, a halide, and/or a purge/carrier gas. The first silicon precursor 140 may include a hydrogenated first silicon precursor or a chlorinated first silicon precursor. The hydrogenated first silicon precursor may be selected, for example, from a group comprising: silane ($SiH_4$), disilane ($Si_2H_6$), trisilane ($Si_3H_8$), and tetrasilane ($Si_4H_{10}$). The chlorinated first silicon precursor may be selected, for example, from a group comprising: monochlorosilane (MCS), dichlorosilane (DCS), trichlorosilane (TCS), hexachlorodisilane (HCDS), octachlorotrislane (OCS), and silicon tetrachloride (STC).

The second silicon precursor source 112 includes a second silicon precursor 142 and is connected to the reaction chamber 102, e.g., via the precursor conduit 160. More specifically, the second silicon precursor source 112 is connected to the reaction chamber 102 by the injection flange 106. Specifically, the second silicon precursor source 112 is connected to the reaction chamber 102 by the second silicon precursor valve 122, which may also include an MFC operable associated with the controller 130, and the injection flange 106, the second silicon precursor source 112 thereby configured to flow the second silicon precursor 142 into the reaction chamber 102. In certain examples, the second silicon precursor source 112 may be connected to the reaction chamber 102 through the mixer 138 to flow the second silicon precursor 142 into the reaction chamber 102 with one or more of the first silicon precursor 140, another precursor, a halide, and/or a purge/carrier gas. The second silicon precursor 142 may include a hydrogenated silicon precursor or a chlorinated silicon precursor. The hydrogenated second silicon precursor may be selected, for example, from a group comprising: silane ($SiH_4$), disilane ($Si_2H_6$), trisilane ($Si_3H_8$), and tetrasilane ($Si_4H_{10}$). The chlorinated second silicon precursor may be selected, for example, from a group comprising: monochlorosilane (MCS), dichlorosilane (DCS), trichlorosilane (TCS), hexachlorodisilane (HCDS), octachlorotrislane (OCS), and silicon tetrachloride (STC).

The germanium precursor source 114 includes a germanium precursor 144 and is connected to the reaction chamber 102, e.g., via the precursor conduit 160. More specifically, the germanium precursor source 114 is connected to the reaction chamber 102 by the injection flange 106. Specifically, the second silicon precursor source 112 is connected to the reaction chamber 102 by the germanium precursor valve 124, which may additionally include an MFC operably associated with the controller 130, and injection flange 106, the germanium precursor source 114 thereby configured to flow the germanium precursor 144 into the reaction chamber 102. In certain examples, the germanium precursor source 114 may be connected to the reaction chamber 102 through the mixer 138 to flow the germanium precursor 144 into the reaction chamber 102 with one or more of the first silicon precursor 140, the second silicon precursor 142, a halide, and/or a purge/carrier gas 148. The germanium precursor 144 may be selected, for example, from a group comprising: germane ($GeH_4$), digermane ($Ge_2H_6$), trigermane ($Ge_3H_8$), and germylsilane ($GeH_6Si$).

The halide source 116 includes a halide 146 and is connected to the reaction chamber 102, e.g., via an etchant conduit 162. More specifically, the halide source 116 is connected to the reaction chamber 102 by the injection flange 106. Specifically, the halide source 116 is connected to the reaction chamber 102 by the halide valve 126, which may include an MFC operably associated with the controller 130, and the injection flange 106, the halide source 116 thereby configured to flow the halide 146 into the reaction chamber 102. In certain examples, the halide source 116 may be connected to the reaction chamber 102 through the mixer 138 to flow the halide 146 into the reaction chamber 102 with one or more of the first silicon precursor 140, the second silicon precursor 142, the germanium precursor 144, and/or a purge/carrier gas. The halide 146 may be selected, for example, from a group comprising: chlorine ($Cl_2$) and hydrochloric acid (HCl).

The purge/carrier gas source 118 includes a purge/carrier gas 148 and is connected to the reaction chamber 102, e.g., via the etchant conduit 162. More specifically, the purge/carrier gas source 118 is to the reaction chamber 102 by the injection flange 106. Specifically, the purge/carrier gas source 118 is connected to the reaction chamber 102 by the purge/carrier gas valve 128 and the injection flange 106, the purge/carrier gas source 118 thereby configured to flow the purge/carrier gas 148 into the reaction chamber 102. In certain examples, the purge/carrier gas source 118 may be connected to the reaction chamber 102 by the mixer 138, e.g., through one or more of the precursor sources and/or the halide source, to flow the purge/carrier gas 148 into the reaction chamber 102 with one or more of the first silicon precursor 140, the second silicon precursor 142, the germanium precursor 144, and/or the halide 146. The purge/carrier gas 148 may be selected, for example, from a group comprising: helium (He), hydrogen ($H_2$), argon (Ar), krypton (Kr), nitrogen ($N_2$), and mixtures thereof.

The controller 130 is operatively connected to semiconductor processing system 100 and is configured to form a structure, e.g., a layer, overlaying the substrate using one or more precursor, a halide, and/or a purge/carrier gas. In this illustrated example the controller 130 includes a processor 150, a device interface 152, a user interface 154, and a memory 156. The device interface 152 connects the controller 130 to the semiconductor processing system 100, e.g., via wired or wireless link, for operative connection therethrough with one or more of the reaction chamber 102, the first silicon precursor valve 120, the second silicon precursor valve 122, the germanium precursor valve 124, the halide valve 126, and/or the purge/carrier gas valve 128. The user interface 154 is operatively associated with the processor 150 and is configured to communicate output and/or receive input from a user. The memory 156 is disposed in communication with the processor 150 and has a plurality of program modules 158 recorded there having instructions that, when read by the processor 150, cause the processor 150 to execute certain operations. Among the operations are operations of the method 200 of forming a structure overlaying a substrate, e.g., the silicon-germanium layer 14 overlaying the substrate 10.

Figure 2:
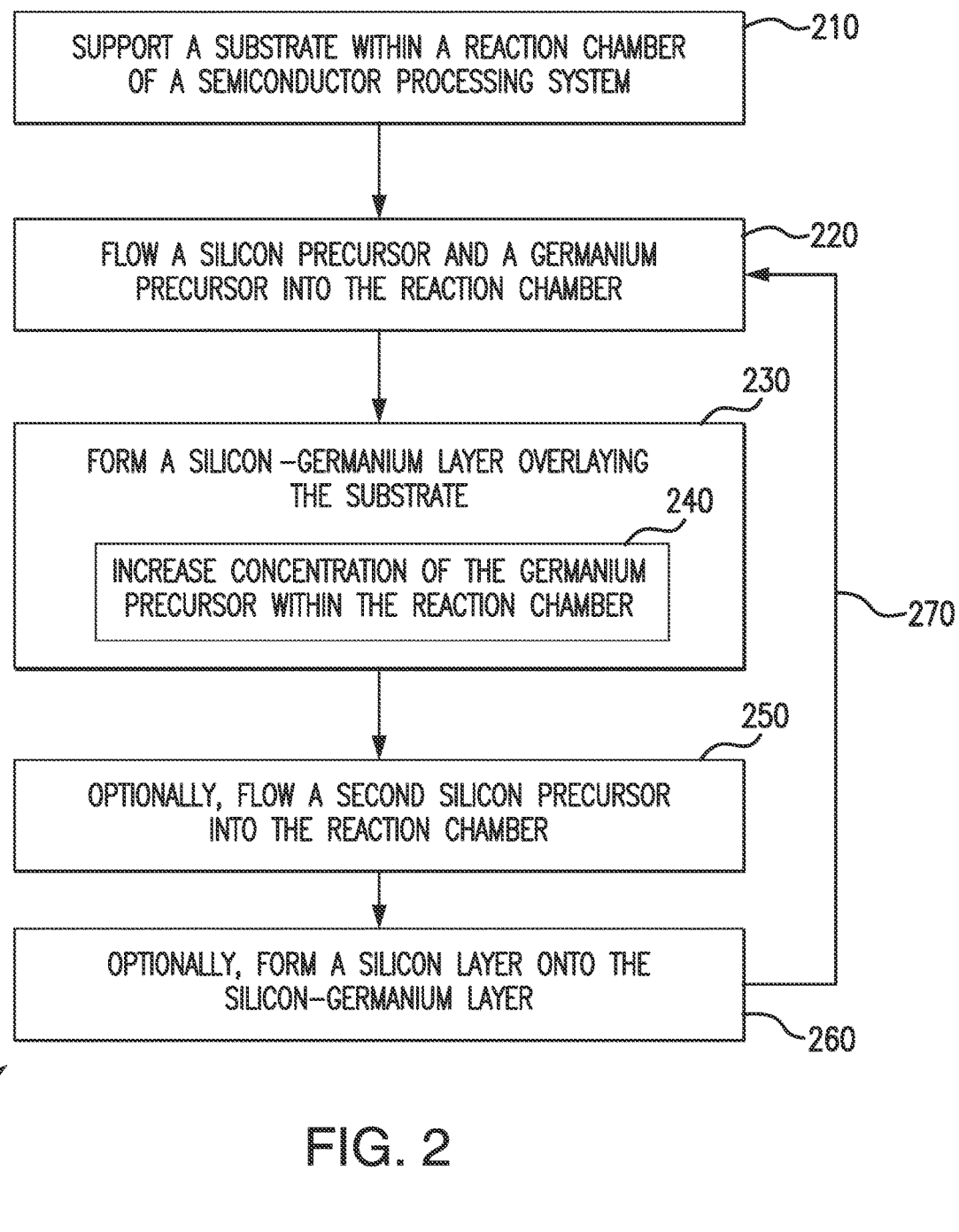
FIG. 2 is a process flow diagram of a method of forming structure, showing operations of the method according to an illustrative and non-limiting example of the method.

With reference to FIG. 2, the method 200 is shown according an illustrative and non-limiting example the method. As shown with box 210, a substrate, e.g., the substrate 10 (shown in FIG. 1), is supported within a reaction chamber of a semiconductor processing system, e.g., the reaction chamber 102 (shown in FIG. 1). As shown with box 220, a first silicon precursor and a germanium precursor are flowed within reaction chamber, e.g., the first silicon precursor 140 (shown in FIG. 1) and the germanium precursor 144 (shown in FIG. 1). As shown with box 230, a silicon-germanium layer is formed overlaying the substrate, e.g., the silicon-germanium layer 14 (shown in FIG. 1) overlaying the substrate 10 (shown in FIG. 1), using the first silicon precursor and the germanium precursor. As shown with box 240, concentration of the germanium precursor within the reaction chamber is increased during the forming of the silicon-germanium layer. Optionally, as shown with box 250 and box 260, a second silicon precursor may be flowed into the reaction chamber and a silicon layer, e.g., the silicon layer 16 (shown in FIG. 1), formed onto the silicon-germanium layer.

Supporting 210 the substrate within the reaction chamber may include supporting a blanket substrate within the reaction chamber. The blanket substrate may be formed from a bulk semiconductor material, such as silicon, and may include a silicon wafer. An electrically insulative layer may overlay the substrate. The electrically insulative layer may include a silicon oxide material. The electrically insulative layer may include a silicon nitride material.

Supporting 210 the substrate within the reaction chamber include supporting a patterned substrate within the reaction chamber. The patterned substrate may include a semiconductor device structure formed into or onto a surface of the substrate. For example, the patterned substrate may include a partially fabricated semiconductor device structure such as a transistor, a memory element, or a power electronic circuit element. The patterned substrate may include a non-planar surface having one or more FinFET structure or gate-all-around structure extending upward from the surface of the substrate and/or one or more indentations extending into the surface of the substrate. In certain examples, the patterned substrate may have a non-monocrystalline surface, such as a polycrystalline surface or an amorphous surface. The polycrystalline or amorphous surface may include dielectric material, such as oxides, oxynitrides, or nitrides, such as silicon oxides and silicon nitrides. In accordance with certain examples, the patterned substrate may have a monocrystalline surface. Examples of monocrystalline surfaces include silicon (Si) surfaces, silicon-germanium (SiGe) surfaces, germanium tin (GeSn) surfaces, and germanium (Ge) surfaces.

Supporting 210 the substrate within the reaction chamber may include heating the substrate to a predetermined silicon-germanium layer deposition temperature. The predetermined silicon-germanium deposition temperature may be less about than 800 degrees Celsius (° C.), or less than about 700° C., or less than about 600° C., or less than about 500° C., or even less than about 400° C. In certain examples, forming 230 the silicon-germanium layer may include heating the substrate to a predetermined silicon-germanium deposition temperature that is between about 400° C. and about 800° C.

Supporting 210 the substrate within the reaction chamber may include establishing a predetermined silicon-germanium layer deposition pressure within the reaction chamber. The predetermined silicon-germanium layer deposition pressure may be less than about 760 torr, or less than about 600 torr, or less than about 400 torr, or less than about 200 torr, or less than about 50 torr, or even less than about 5 torr. In certain examples, forming 230 the silicon-germanium layer may comprise maintaining a pressure with the reaction chamber that is between about 5 torr and about 760 torr.

Flowing 220 the first silicon precursor and the germanium precursor into the reaction chamber may include flowing a hydrogenated first silicon precursor into the reaction chamber. The hydrogenated first silicon precursor may be selected, for example, from a group comprising: silane ($SiH_4$), disilane ($Si_2H_6$), trisilane ($Si_3H_8$), and tetrasilane ($Si_4H_{10}$). Flowing 220 the first silicon precursor and the germanium precursor into the reaction chamber may include flowing a chlorinated first silicon precursor into the reaction chamber. The chlorinated first silicon precursor may be selected, for example, from a group comprising: monochlorosilane (MCS), dichlorosilane (DC S), trichlorosilane (TCS), hexachlorodisilane (HCDS), octachlorotrislane (OCS), and silicon tetrachloride (STC).

Flowing 220 the first silicon precursor and the germanium precursor into the reaction chamber may include flowing a hydrogenated germanium precursor into the reaction chamber. The hydrogenated germanium precursor may be selected, for example, from a group comprising: germane ($GeH_4$), digermane ($Ge_2H_6$), trigermane ($Ge_3H_8$), and germylsilane ($GeH_6Si$). Flowing 220 the first silicon precursor and the germanium precursor into the reaction chamber may include flowing a halide into the reaction chamber with the first silicon precursor and the germanium precursor. The halide may be selected, for example, from a group comprising: chlorine ($Cl_2$) and hydrochloric acid (HCl).

Forming 230 the silicon-germanium layer may include forming the silicon-germanium layer as a silicon-germanium epitaxial layer. In certain examples, forming 230 the silicon-germanium layer using the first silicon precursor and the germanium precursor may include flowing the first silicon precursor into the reaction chamber at a predetermined first silicon precursor flow rate of less than about 500 standard cubit centimeters per minute (sccm), or less than about 250 sccm, or even less than about 50 sccm. For example, the predetermined first silicon precursor flow rate may be between about 1 sccm and about 500 sccm. Forming 230 the silicon-germanium layer using the first silicon precursor and the germanium precursor may include flowing the germanium precursor into the reaction chamber at a predetermined germanium precursor flow rate. For example, the germanium precursor may be flowed into the reaction chamber at a predetermined germanium precursor flow rate that is between less than about 1000 sccm, or less than about 300 sccm, or less than about 10 sccm. For example, the germanium precursor may flow into the reaction chamber at a flow rate that is between about 1 sccm and about 1000 sccm. Forming 230 the silicon-germanium layer using the first silicon precursor and the germanium precursor may include flowing the halide gas into the reaction chamber at a predetermined halide gas flow rate that is less than about 500 sccm, or less than about 250 sccm, or less than about 100 sccm. For example, the halide gas may flow into the reaction chamber at a predetermined halide gas flow rate than is between about 1 sccm and about 500 sccm.

Forming 230 the silicon-germanium layer using the first silicon precursor and the germanium precursor may include forming the silicon-germanium layer with a predetermined silicon-germanium layer thickness. For example, the predetermined silicon-germanium layer thickness may be greater than about 5 angstroms, or greater than about 10 angstroms, or greater than about 20 angstroms, or greater than about 40 angstroms, or greater than about 60 angstroms, or even greater than about 80 angstroms. In certain examples, the predetermined silicon-germanium layer thickness may be greater than about 100 angstroms, or greater than about 250 angstroms, or even greater than about 500 angstroms. The predetermined silicon-germanium layer thickness may be less than about 20 angstroms, or less than about 10 angstroms, or less than about 5 angstroms. In certain examples, the predetermined silicon-germanium layer thickness may be between about 10 angstroms and about 500 angstroms.

Forming 230 the silicon-germanium layer may include forming the silicon-germanium layer with a predetermined germanium concentration. For example, the silicon-germanium ($Si_{1-x}Ge_x$) layer may have a germanium content (x) that is greater than about 0.05, or is greater than about 0.3, or is greater than about 0.4, or is greater than about 0.5, or is greater than about 0.6, or is even greater than about 0.7. In certain examples, the silicon-germanium ($Si_{1-x}Ge_x$) layer may have a germanium content (x) that is between about 0.05 and about 0.7 or between about 0.3 and about 0.5.

Increasing 240 concentration of the germanium precursor within the reaction chamber may include increasing partial pressure of the germanium precursor within the reaction chamber relative to partial pressure of the silicon precursor within the reaction during the forming of the silicon-germanium layer. For example, increasing 240 concentration of the germanium precursor within the reaction chamber may include increasing germanium precursor to less than about 180% of germanium precursor concentration at the start of the forming of the silicon-germanium layer. Increasing 240 concentration of the germanium precursor within the reaction chamber may be increased to less than about 160% of germanium precursor concentration at the start of the forming of the silicon-germanium layer, or less than about 140% of germanium precursor concentration at the start of the forming of the silicon-germanium layer, or less than about 120% of germanium precursor concentration at the start of the forming of the silicon-germanium layer, or less than about 100.5% of germanium precursor at the start of the forming of the silicon-germanium layer. In certain examples, increasing 240 concentration of the germanium precursor within the reaction chamber may include increasing concentration of the germanium precursor to between about 100.5% and about 180% of the concentration of the germanium precursor at the start of the forming of the silicon-germanium layer.

With reference to FIGS. 3A-3C and FIGS. 4A-4C, in certain examples, increasing 240 (shown in FIG. 2) concentration of the germanium precursor within the reaction chamber may include continuously increasing concentration of the germanium precursor during the forming of the silicon-germanium layer. For example, as shown in FIG. 3A, increasing concentration of the germanium precursor within the reaction chamber, e.g., the reaction chamber 102 (shown in FIG. 1), may be increased according to a linear function 300 during the forming of the silicon-germanium layer. Advantageously, as shown in FIG. 4A, increasing concentration of the germanium precursor within the reaction chamber according to the linear function 300 during the forming of the silicon-germanium layer, e.g., the silicon-germanium layer 14 (shown in FIG. 1), causes germanium concentration to be uniform between the bottom of the silicon-germanium layer (shown with the leftmost vertical dashed line) and the top of the silicon-germanium layer (shown with the rightmost vertical dashed line) in comparison to a nominal concentration profile 402, e.g., a germanium concentration profile resulting from the concentration of germanium precursor remaining constant during the forming of the silicon-germanium layer. As will be appreciated by those of skill in the art in view of the present disclosure, uniformity of germanium concentration within the thickness of the silicon-germanium layer may be employed to limit (or eliminate) variation that could otherwise be introduced into semiconductor device structures defined by the silicon-germanium layer, e.g., nanowires within gate-all-around transistor device structures, due to the influence that germanium concentration may have upon the selectivity of certain etchants.

As shown in FIGS. 3B and 3C, increasing 240 (shown in FIG. 2) concentration of the germanium precursor within the reaction chamber may be according to a nonlinear function during the forming of the silicon-germanium layer. For example, as shown in FIG. 3B, concentration of the germanium precursor within the reaction chamber may be increased according to a logarithmic function 302 during the forming of the silicon-germanium layer. Advantageously, as shown in FIG. 4B, increasing concentration of the germanium precursor within the reaction chamber according to the logarithmic function 302 during the forming of the silicon-germanium layer may result in a germanium concentration profile 404, wherein germanium concentration increases between the bottom of the silicon-germanium layer (shown with the leftmost vertical dashed line in FIG. 3B and FIG. 4B) and the top of the silicon-germanium layer (shown with the rightmost vertical dashed line in FIG. 3B and FIG. 4B). As will also be appreciated by those of skill in the art in view of the present disclosure, increasing germanium concentration between the bottom and the top of the silicon-germanium layer allows increasing germanium concentration to be employed as a process tool in semiconductor devices defined by the silicon-germanium layer. For example, the silicon layer 16 (shown in FIG. 1) formed onto the silicon germanium layer may be exposed to an etchant prior to the underlaying substrate (or layer) due to the tendency of the etch rate of certain etchants to increase with germanium concentration.

As shown in FIG. 3C, increasing 240 (shown in FIG. 2) concentration of the germanium precursor within the reaction chamber may be increased according to an exponential function 304 during the forming of the silicon-germanium layer. Advantageously, as shown in FIG. 4C, increasing concentration of the germanium precursor within the reaction chamber according to the exponential function 304 (shown in FIG. 3C) may result in a germanium concentration profile 406 wherein germanium concentration decreases between the bottom (shown with the leftmost vertical dashed line in FIG. 3C and FIG. 4C) and the top of the silicon-germanium layer (shown with the rightmost vertical dashed line FIG. 3C and FIG. 4C). As will further be appreciated by those of skill in the art in view of the present disclosure, decreasing germanium concentration between the bottom and the top of the silicon-germanium layer allows the decreasing germanium concentration to be employed as a process tool in semiconductor devices defined by the silicon-germanium layer. For example, the silicon layer 16 (shown in FIG. 1) formed onto the silicon germanium layer may be exposed to an etchant subsequent to the underlaying substrate (or layer) due to the tendency of the etch rate of certain etchants to increase with germanium concentration.

With continuing reference to FIG. 2, flowing 250 the second silicon precursor into the reaction chamber may include flowing a hydrogenated second silicon precursor into the reaction chamber. The hydrogenated second silicon precursor may be selected, for example, from a group comprising: silane ($SiH_4$), disilane ($Si_2H_6$), trisilane ($Si_3H_8$), or tetrasilane ($Si_4H_{10}$). Flowing 250 the second silicon precursor into the reaction chamber may include flowing a chlorinated second silicon precursor into the reaction chamber. The chlorinated second silicon precursor may be selected, for example, from a group comprising: monochlorosilane (MCS), dichlorosilane (DC S), trichlorosilane (TCS), hexachlorodisilane (HCDS), octachlorotrislane (OCS), and silicon tetrachloride (STC). In certain examples, the second silicon precursor may be the same as the first silicon precursor. In accordance with certain examples, the second silicon precursor may be different that the first silicon precursor. It is also contemplated that, in accordance with certain examples, that the second silicon precursor may be a chlorinated second precursor and the first silicon precursor may be a hydrogenated first silicon precursor.

Forming 260 the silicon layer using the second silicon precursor may include forming a silicon epitaxial layer onto the silicon-germanium layer. In certain examples, forming 260 the silicon layer may include heating the substrate to a predetermined silicon layer deposition temperature. For example, the predetermined silicon layer deposition temperature may be less than about 850° C., or less than about 700° C., or to less than about 600° C., or less than about 500° C., or even less than about 400° C. The predetermined silicon layer deposition temperature may be less than about 550° C., or less than about 500° C., or less than about 450° C., or even less than about 400° C. In certain examples, the substrate may be heated to a predetermined silicon layer deposition temperature that is between about 450° C. and about 850° C. In accordance with certain examples, the predetermined silicon layer deposition temperature may be equivalent to the predetermined silicon-germanium layer deposition temperature.

Forming 260 the silicon layer onto the silicon-germanium layer may include establishing a predetermined silicon layer deposition pressure within the reaction chamber. For example, the predetermined silicon layer deposition pressure may be less than about 760 torr, or less than about 500 torr, or less than about 200 torr. The predetermined silicon layer deposition pressure may be less than about 100 torr, or less about 50 torr, or even less than about 5 torr. In certain examples, the predetermined silicon layer deposition pressure may be between about 760 torr and about 5 torr.

Forming 260 the silicon layer using the second silicon precursor may include forming the silicon layer on the silicon-germanium layer to form a film stack, e.g., the film stack 12 (shown in FIG. 1). In certain examples, forming 260 the silicon layer may include forming the silicon layer with a predetermined silicon layer thickness. For example, the predetermined silicon layer thickness may be greater than about 10 angstroms, or greater than about 20 angstroms, or greater than about 40 angstroms, or greater than about 60 angstroms, or greater than about 80 angstroms. In certain examples, the predetermined silicon layer thickness may be greater than about 100 angstroms, or greater than about 250 angstroms, or even greater than about 500 angstroms. In accordance with certain examples, the predetermined silicon layer thickness may be less than about 20 angstroms, or less than about 10 angstroms, or less than about 5 angstroms. In further examples, the predetermined silicon thickness may be between about 20 angstroms and about 500 angstroms. In certain examples, the predetermined silicon layer thickness and the predetermined silicon-germanium layer thickness may be substantially equivalent. In accordance with certain examples, the predetermined silicon layer thickness may be greater than or smaller than the predetermined silicon-germanium layer thickness.

As shown with arrow 270, the silicon-germanium layer and the silicon layer may be a first layer pair, and the method 200 may include forming at least one second layer pair onto the first layer pair. The second layer pair may include a second silicon-germanium formed onto the silicon layer and overlaying the substrate, and a second silicon layer formed onto the second silicon-germanium layer and further overlaying the substrate. The first layer pair and the second layer pair may form a film stack, such as a film stack for a source, a drain, and/or a channel for a FinFET or a gate-all-around semiconductor device structure.

The examples presented above do not limit the scope of the present disclosure as these examples merely illustrate the present invention, which is defined by the appended claims and legal equivalents. Any equivalent embodiments are intended to be within the scope of the present disclosure. Indeed, various modifications of the present disclosure, in addition to those shown and described herein, such as alternative useful combinations of the elements described, may become apparent to those skilled in the art from the present description. Such modifications and embodiments are also intended to fall within the scope of the appended claims.

The terminology used herein is for the purpose of describing particular examples only and is not intended to limit the claims. As used herein, the singular forms "a," "an," and "the" are intended to include plural forms as well, unless the context clearly indicates otherwise. It will be further understood that the terms "includes," "including," "has," "having," "comprises," and/or "comprising," when used in this specification, specify the presence of state features, integers, steps, operations, elements, and/or components, but do not preclude the presence or addition of one or more other features, integers, steps, operations, elements, components, and/or groups thereof.

PARTS LIST

10 Substrate
12 Film Stack
14 Silicon-Germanium Layer
16 Silicon Layer
18 Lower Transition Thickness Portion
20 Intermediate Thickness Portion
22 Upper Transition Thickness Portion
100 Semiconductor Processing System
102 Reaction Chamber
104 Exhaust Flange
106 Injection Flange
108 Substrate Holder
110 First Silicon Precursor Source
112 Second Silicon Precursor Source
114 Germanium Precursor Source
116 Halide Source
118 Purge/Carrier Gas Source
120 First Silicon Precursor Valve
122 Second Silicon Precursor Valve
124 Germanium Precursor Valve
126 Halide Valve
128 Purge/Carrier Gas Valve
130 Controller
132 Injection End
134 Exhaust End
136 Interior
138 Mixer
140 First Silicon Precursor
142 Second Silicon Precursor
144 Germanium Precursor
146 Halide
148 Purge/Carrier Gas
150 Processor
152 Device Interface
154 User Interface
156 Memory
158 Program Modules
160 Precursor Conduit
162 Halide Conduit
200 Method
210 Box
220 Box
230 Box
240 Box
250 Box
260 Box
270 Arrow
300 Linear Function
302 Logarithmic Function
304 Exponential Function
400 Within-Layer Ge Concentration with Linearly Increasing Ge Precursor Concentration
402 Within-Layer Ge Concentration with Constant Ge Precursor Concentration
404 Within-Layer Ge Concentration with Logarithmically Increasing Ge Precursor Concentration
406 Within-Layer Ge Concentration with Exponentially Increasing GE Precursor Concentration

The invention claimed is:

1. A method of forming a structure, comprising:
supporting a substrate within a reaction chamber of a semiconductor processing system;
flowing a silicon precursor and a germanium precursor into the reaction chamber;
forming a silicon-germanium layer overlaying the substrate with the silicon precursor and the germanium precursor; and
forming a silicon layer directly overlaying the silicon-germanium layer;
wherein the concentration of the germanium precursor within the reaction chamber continuously increases throughout the step of the forming the silicon-germanium layer overlaying the substrate, and
wherein a germanium concentration is uniform from a bottom of the silicon-germanium layer to a top of the silicon-germanium layer by increasing concentration of the germanium precursor within the reaction chamber according to a linear function during the step of forming the silicon-germanium layer.

2. The method of claim 1, wherein the substrate is a blanket substrate or a patterned substrate.

3. The method of claim 1, wherein forming a silicon-germanium layer comprises forming a silicon-germanium epitaxial layer.

4. The method of claim 1, wherein the silicon precursor comprises a hydrogenated silicon precursor and a chlorinated silicon precursor.

5. The method of claim 4, wherein the hydrogenated precursor is selected from a group comprising: silane ($SiH_4$), disilane ($Si_2H_6$), trisilane ($Si_3H_8$), and tetrasilane ($Si_4H_{10}$).

6. The method of claim 4, wherein the chlorinated silicon precursor is selected from a group comprising: monochlorosilane (MCS), dichlorosilane (DCS), trichlorosilane (TCS), hexachlorodisilane (HCDS), octachlorotrisilane (OCS), and silicon tetrachloride (STC).

7. The method of claim 1, wherein the step of flowing the silicon precursor and the germanium precursor into the reaction chamber comprises flowing a halide into the reaction chamber, wherein the halide is selected from a group comprising: chlorine ($Cl_2$) and hydrochloric acid (HCl).

8. The method of claim 1, further comprising flowing a purge/carrier gas into the reaction chamber during the forming of the silicon-germanium layer, wherein the purge/carrier gas is selected from a group comprising: helium (He), hydrogen ($H_2$), argon (Ar), krypton (Kr), and nitrogen ($N_2$).

9. The method of claim 1, wherein the step of forming the silicon-germanium layer comprises heating the substrate to a temperature of between about 400° C. and about 800° C.

10. The method of claim 1, wherein the step of forming the silicon-germanium layer comprises maintaining a pressure within the reaction chamber of between about 760 Torr and about 5 Torr.

11. The method of claim 1, wherein forming the silicon layer consists essentially of flowing a second silicon precursor.

12. The method of claim 11, wherein the second silicon precursor is the same as the first silicon precursor.

13. The method of claim 11, wherein the second silicon precursor is different than the first silicon precursor.

14. The method of claim 1, wherein increasing concentration of the germanium precursor within the reaction chamber during the forming of the silicon-germanium layer comprises increasing concentration of the germanium precursor from to between about 100.5% and about 180% of an initial concentration of the germanium precursor.

15. A method of forming a structure, comprising:
supporting a substrate within a reaction chamber of a semiconductor processing system;
flowing a silicon precursor and a germanium precursor into the reaction chamber;
forming a silicon-germanium layer overlaying the substrate with the silicon precursor and the germanium precursor; and
forming a silicon layer directly overlaying the silicon-germanium layer;
wherein the concentration of the germanium precursor within the reaction chamber continuously increases throughout the step of the forming the silicon-germanium layer overlaying the substrate,
wherein a germanium concentration decreases from a bottom of the silicon-germanium layer to a top of the silicon-germanium layer by increasing concentration of the germanium precursor within the reaction chamber according to an exponential function during the step of forming the silicon-germanium layer.

16. A method of forming a film stack structure, comprising:
supporting a substrate within a reaction chamber of a semiconductor processing system, wherein the substrate is a blanket substrate;
flowing a first silicon precursor, a germanium precursor, and a halide into the reaction chamber, wherein the halide is selected from a group comprising chlorine ($Cl_2$) and hydrochloric acid (HCl);
forming a silicon-germanium layer overlaying the substrate with the first silicon precursor and the germanium precursor, wherein the first silicon precursor comprises a hydrogenated first silicon precursor and a chlorinated first silicon precursor;
flowing a second silicon precursor into the reaction chamber;
forming a silicon layer directly onto the silicon-germanium layer with the second silicon precursor, wherein the second silicon precursor is selected from a group comprising: silane ($SiH_4$), disilane ($Si_2H_6$), trisilane ($Si_3H_8$), tetrasilane ($Si_4H_{10}$) and dichlorosilane (DCS);
wherein the concentration of the germanium precursor within the reaction chamber continuously increases throughout the step of the forming the silicon-germanium layer overlaying the substrate; and
wherein a germanium concentration is uniform from a bottom of the silicon-germanium layer to a top of the silicon-germanium layer by increasing concentration of the germanium precursor within the reaction chamber according to a linear function during the step of forming the silicon-germanium layer.

* * * * *